US 6,744,153 B2

(12) United States Patent  
Ito et al.

(10) Patent No.: US 6,744,153 B2  
(45) Date of Patent: *Jun. 1, 2004

(54) APPARATUS FOR AND METHOD OF GENERATING A PULSE SIGNAL

(75) Inventors: Tomoaki Ito, Tokyo (JP); Masami Tanaka, Tokyo (JP); Tadashi Kubota, Tokyo (JP); Yasuhiro Masuzaki, Tokyo (JP); Osamu Uchiyama, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 227 days.

This patent is subject to a terminal disclaimer.

(21) Appl. No.: 09/995,758

(22) Filed: Nov. 29, 2001

(65) Prior Publication Data

US 2002/0033645 A1 Mar. 21, 2002

Related U.S. Application Data

(63) Continuation-in-part of application No. 09/383,932, filed on Aug. 26, 1999, now abandoned, and a continuation-in-part of application No. 09/383,933, filed on Aug. 26, 1999, now abandoned.

(30) Foreign Application Priority Data

Sep. 18, 1998 (JP) .............................. 10-264678  
Sep. 18, 1998 (JP) .............................. 10-264679

(51) Int. Cl.[7] ................................................ H02M 5/10  
(52) U.S. Cl. ...................................................... 307/419  
(58) Field of Search ............................ 307/419–421, 307/104.16; 327/510; 73/861.77, 861.78, 514.39; 324/173, 174, 207.15, 207.22

(56) References Cited

U.S. PATENT DOCUMENTS

| | | | | |
|---|---|---|---|---|
| 3,780,313 A | * | 12/1973 | Wiegand | 307/106 |
| 4,503,348 A | * | 3/1985 | Esper et al. | 310/155 |
| 4,639,670 A | * | 1/1987 | Normann | 324/260 |
| 4,743,780 A | * | 5/1988 | Opie | 307/419 |
| 4,758,742 A | * | 7/1988 | Opie | 307/419 |
| 5,010,263 A | | 4/1991 | Murata | |
| 5,057,727 A | * | 10/1991 | Jones | 310/68 B |
| 5,181,020 A | * | 1/1993 | Furukawa et al. | 340/551 |
| 5,530,298 A | * | 6/1996 | Gerhold | 307/106 |
| 6,140,727 A | * | 10/2000 | Goto et al. | 310/155 |
| 6,160,322 A | * | 12/2000 | Gotoh et al. | 307/106 |
| 6,384,595 B1 | * | 5/2002 | Ito et al. | 324/207.13 |

FOREIGN PATENT DOCUMENTS

| | | |
|---|---|---|
| JP | 54-161257 | 12/1979 |
| JP | 2-284082 | 11/1990 |

* cited by examiner

Primary Examiner—Gregory J. Toatley, Jr.  
(74) Attorney, Agent, or Firm—Kanesaka & Takeuchi (57) ABSTRACT

A pulse signal generator comprising a magnetic element able (1) to cause a large Barkhausen jump; a detection member (2) for detecting a magnetic change in the magnetic element to generate a pulse signal; and a pair of magnetic field sources (3, 4, 6, and 7) provided in parallel to each other on both sides of the magnetic element such that their poles (3A, 4A) are opposed to each other so that when an object (5A) advances from one of opposite poles to the other of the magnetic field sources, a magnetic field applied to the magnetic element changes, causing a large Barkhausen jump in the magnetic element, thus causing the detection member to generate a pulse signal.

13 Claims, 8 Drawing Sheets

THERE IS NO OBJECT.

FIG. 3

OBJECT FACES UPPER MAGNET.

FIG. 4

OBJECT FACES LOWER MAGNET.

THERE IS NO OBJECT.

FIG. 14

OBJECT FACES UPPER MAGNET.

FIG. 15

OBJECT FACES LOWER MAGNET.

APPARATUS FOR AND METHOD OF GENERATING A PULSE SIGNAL

CROSS REFERENCES TO RELATED APPLICATIONS

This is a continuation-in-part application of application Ser. Nos. 09/383,932 and 09/383,933, both filed Aug. 26, 1999, now abandoned.

BACKGROUND OF THE INVENTION

1. Field of the Invention

The present invention relates to a method of and apparatus for generating a pulse signal.

2. Description of the Related Art

It is necessary to generate a pulse signal in response to the position or speed of a moving object or pulse signals in response to various operations in automatic controls or electric or electronic equipment. An example is an electromagnetic pickup among various pulse signal generators of this type. This electromagnetic pickup consists of a magnetic element, magnets, and an electric coil such that movement of an object changes the magnetic density which, in turn, generates a voltage in the electric coil by electromagnetic induction. This voltage is used as a pulse signal.

This electromagnetic pickup, however, has the following disadvantages. When the object to be detected moves at a very low speed, the generated voltage is as low as the noise level. Consequently, it is necessary to provide a filter circuit in front of an amplifying circuit to eliminate noise before amplification. Conversely, when the speed of a moving object is very high, the generated voltage exceeds the maximum voltage of an amplifying circuit and needs a limiter. On the case of low speed, it has been proposed that an auxiliary ring having an enlarged diameter is attached to the object to increase the peripheral speed for detection. However, this proposition makes the equipment larger and the number of components larger. In addition, if the speed varies, the rising or falling time varies. The detection of more accurate timing requires a complicated signal process. Moreover, the waveform of the voltage depends on the shape of the object.

Another example is a position, angular, or speed sensor using Hall effects such as shown in Japanese patent application Kokai No. 2-284082. This Hall effect type sensor employs a Hall element and a magnet. Movement of the object to be detected changes the magnetic flux to the Hall element which, in turn, generates an electrical signal. This sensor, however, needs a separate power source to energize the Hall element. The generated electrical signal is not pulse but sinusoidal. Where the speed of an object is low, the rising voltage is decreased and the waveform is crashed. Like the above electromagnetic pickup, this sensor is prone to not only external magnetic field but also thermal drift and noise. In order to provide more accurate detection signal, a complicated processor circuit is required.

Japanese patent application Kokai No. 54-161257 discloses a pulse signal generator for use as a sensor. This pulse signal generator comprises a magnetically sensitive element made from a ferromagnetic body which consists of a relatively soft and magnetically anisotropic section and a relatively hard section, a first magnetic field source for magnetizing the magnetically sensitive element in the positive direction, a second magnetic field source for magnetizing the relatively soft section in the negative direction, a detection coil provided near the magnetically sensitive element, and a movable body for intermitedly reducing the magnetization of the magnetically sensitive element by the first magnetic field source. Movement of the movable body causes a predetermined change in the magnetically sensitive element thereby generating a pulse voltage in the detection coil.

This pulse signal generator needs no power source and provides constant pulse voltages when the object moves at very low speeds and is resistant to external magnetic field. Thus, it solves some of the problems presented by the electromagnetic pickup and Hall effect type sensor.

The conventional pulse signal generator, however, has the following disadvantages, has limited applications, and is not practical. First of all, it needs a movable body having slits. It is impossible to make the movable body smaller than the first and second magnetic field source and the magnetically sensitive element. The slits are provided in the movable body radially so that the diameter of the movable body must be large. In addition, the movable body, the magnets, and the magnetically sensitive element must be parallel to each other. The magnets are so prone to external magnetic fields or metals that the operation is unstable. The generator is not always interchangeable for the electromagnetic pickup or Hall effect type sensor because of the special relationship with the object. For example, it is impossible to dispose it to detect the teeth of a gear directly.

SUMMARY OF THE INVENTION

Accordingly, it is an object of the invention to provide improvements in the pulse signal generating method and apparatus.

According to one aspect of the invention there is provided a method of generating a pulse signal, comprising the steps of providing a pair of magnetic field sources in parallel to each other such that their opposite poles are faced to each other; providing a magnetic element between the parallel magnets; advancing an object from one of the opposite poles to the other to thereby change a magnetic field applied to the magnetic element, which causes a large Barkhausen jump in the magnetic element; and generating a pulse signal in response to the large Barkhausen jump.

According to another aspect of the invention there is provided a pulse signal generator comprising a magnetic element able to cause a large Barkhausen jump; detection means for detecting a magnetic change in the magnetic element to generate a pulse signal; and a pair of magnetic field sources provided in parallel to each other on opposite sides of the magnetic element such that their opposite poles are faced to each other so that when an object advances from one of the opposite poles to the other, a magnetic field applied to the magnetic element changes to cause a large Barkhausen jump in the magnetic element, thus causing the detection means to generate a pulse signal.

According to an embodiment of the invention there is provided a pulse signal generator, the magnetic field sources consist of parallel magnets and magnetic circuit forming members.

According to another embodiment of the invention there is provided a pulse signal generator which further comprises an auxiliary magnetic circuit forming member for connecting the magnetic circuit forming members at other ends which are opposite to the one ends.

According to still another embodiment of the invention there is provided a pulse signal generator, wherein the auxiliary magnetic circuit forming member is connected to the magnetic circuit forming members at varying points.

magnets have a width greater than that of the object.

According to yet another embodiment of the invention there is provided a pulse signal generator, wherein the magnetic element is spaced at an end thereof from the auxiliary magnetic circuit forming member by a predetermined distance.

According to an embodiment of the invention there is provided a pulse signal generator, the magnetic field sources consist of only parallel magnets.

According to another embodiment of the invention the pair of poles has a variable distance.

According to still another embodiment of the invention the magnets have a width greater than that of the object.

According to yet another embodiment of the invention the magnetic element extends from the one end of the magnets to a predetermined distance from the other end of the magnets.

According to an embodiment of the invention the predetermined distance is no more than one half of the magnets.

According to another embodiment of the invention the magnetic element extends at a predetermined angle with a longitudinal direction of the magnets.

DESCRIPTION OF THE PREFERED EMBODIMENTS

The magnetic element able to cause a large Barkhausen jump (also merely "magnetic element") will be described. The structure and operation of a wire-like composite magnetic element, for example, will be described. A wire made by drawing a ferromagnetic body has special magnetic characteristics. When a twisting stress is applied to the ferromagnetic wire, the peripheral region is more twisted than the central region so that the peripheral and central regions have different magnetic characteristics. When this condition is fixed, a magnetic wire having different magnetic characteristics in the peripheral and central regions is provided. The magnetic characteristic in the peripheral region is changed in the magnetization direction by a relatively low magnetic field. The central region, however, is changed in the magnetization direction by a magnetic field higher than that of the peripheral region. That is, the magnetic wire has a composite magnetic body consisting of the peripheral region which is readily magnetized and the central region which is difficult to magnetize. This composite magnetic wire is uniaxial anisotropic. The peripheral and central regions are called "soft" and "hard" layers. The composite magnetic wire is called a wire-like composite "magnetic element".

The magnetization directions of the hard and soft layers of the composite magnetic wire are not fixed. When an external magnetic field sufficiently high to reverse the magnetization direction of the hard layer in the axial direction of the magnetic wire is applied, both the soft and hard layers are magnetized in the same direction. Then, when an external magnetic field sufficiently high to magnetize only the soft layer is applied in the opposite direction, the soft and hard layers are magnetized in the opposite directions. Since the magnetic wire is uniaxial anisotropic, the magnetization direction of the soft layer is stable and kept by the magnetization of the hard layer when the external magnetic field is removed. This external magnetic field is called "set" magnetic field. Then, an external magnetic field in the direction opposite to the set magnetic field is applied to increase the magnetic field. When the external magnetic field exceeds a critical level, the magnetization direction of the soft layer is abruptly inverted. This magnetic field is called "critical magnetic field." The reverse phenomenon is like an avalanche wherein the magnetic wall of the soft layer is shifted to cause instant magnetic inversion. Consequently, the magnetization directions of the soft and hard layers are identical and return to the original state. The applied external magnetic field is higher than the critical magnetic field. This magnetic field is called "reset" magnetic field. This avalanche phenomenon is called large Barkhausen jump. The speed of the magnetization inversion depends on only the large Barkhausen jump and is irrelevant from the external magnetic field.

The magnetic element able to cause a large Barkhausen jump is not limited to the wire-like magnetic element but includes other magnetic elements having similar characteristics. The magnetic element able to cause a large Barkhausen jump includes magnetic elements having no composite layers. Fox example, Japanese patent application Kokai No. 4-218905 discloses a thin film making method by which a thin film magnetic body is formed which is useful as a magnetic element. The magnetic element may be thick film or plate-like sheet. Thus, the magnetic element able to cause a large Barkhausen jump includes a variety of magnetic elements.

Figure 1:
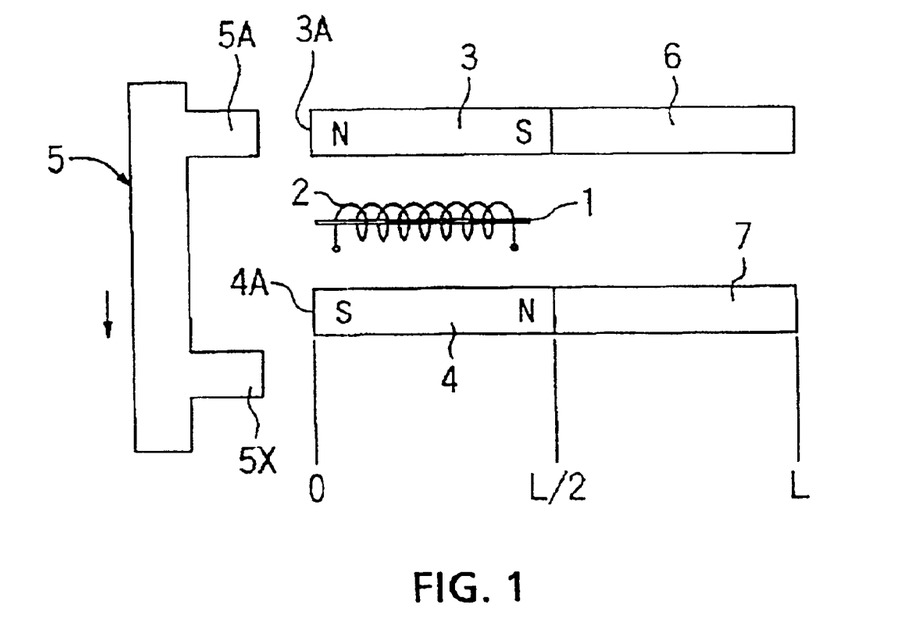
FIG. 1 is a side elevational view of a pulse signal generator according to an embodiment of the invention.

In FIG. 1, a pulse generator comprises a magnetic element 1 having a wire-like shape, a detection coil 2 put around the magnetic element 1, and a pair of magnetic sources each consisting of a permanent magnet 3 or 4 provided on either side of the magnetic element 1 such that their polarities are opposite to each other and a magnetic circuit forming member 6 or 7. The magnetic poles 3A and 4A of the magnetic source constitute a detection section which changes the magnetic field applied to the magnetic element 1 in response to sequential advance of the teeth 5A, 5B, . . . 5X of a toothed wheel 5 or object to be detected, causing large Barkhausen jumps in the magnetic element 1, thus generating pulse signals in the detection coil 2 in response to the large Barkhausen jumps.

The magnetic source (3 and 6) or (4 and 7) has a magnetic axis extending in the longitudinal direction of the magnetic element 1 and a length of L with the permanent magnets 3 and 4 and the magnetic circuit forming members 6 and 7 being L/2 long, respectively.

Figure 2:
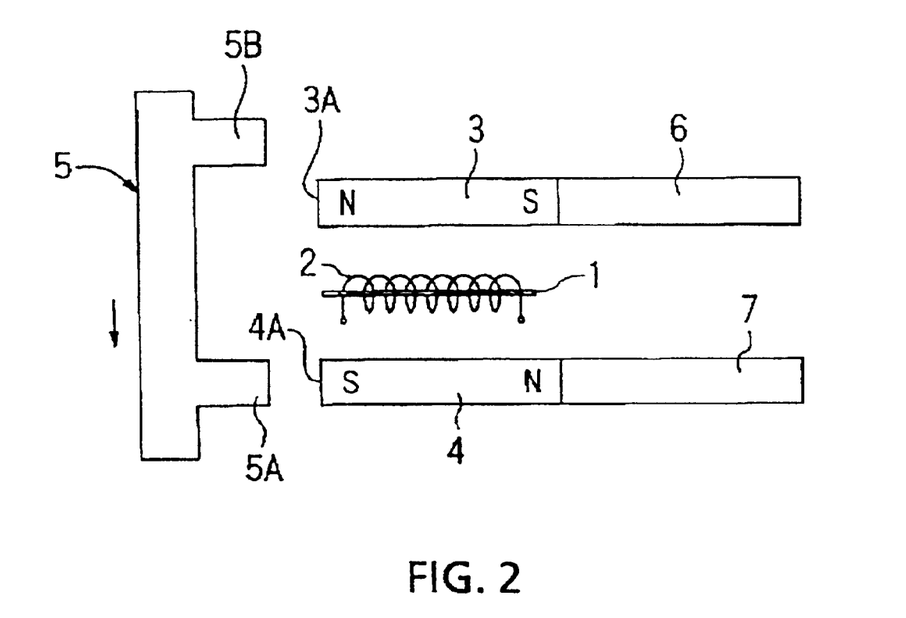
FIG. 2 is a side elevational view of the pulse signal generator in FIG. 1, which is in the reset condition.

The operation of the pulse signal generator will be described with respect to FIGS. 1 and 2. In FIG. 1, the tooth 5A of the toothed wheel 5 is opposed to the N-pole 3A of the permanent magnet 3 while the leading tooth 5X is off from the S-pole 4A of the other permanent magnet 4. Under this condition, the pulse signal generator is in the set condition. In FIG. 2, the toothed wheel 5 is advanced in the direction of an arrow so that the tooth 5A of the toothed wheel 5 is now opposed to the S-pole 4A of the permanent magnet 4 while the tailing tooth 5B is not yet opposed to the N-pole 3A of the other permanent magnet 3. Under this condition, the pulse signal generator is in the reset condition, causing a large Barkhausen jump in the magnetic element 1, which generates a pulse in the detection coil 2. In this way, every time a tooth of the toothed wheel 5 passes the magnetic poles 3A and 4A of the pair of permanent magnets 3 and 4, a pulse signal is generated in the detection coil 2.

According to the invention, the magnetic change of the magnetic element 1 by the large Barkhausen jump is detected by the detection coil 2 as a pulse voltage by electromagnetic induction. The large Barkhausen jump is caused in the magnetic element 1 without failure by the presence or absence of a tooth regardless the speed of teeth 5A, 5B, etc. of the toothed wheel 5 which is an object of detection. Thus, a pulse signal is generated in response to the large Barkhausen jump without failure. In this way, it is possible to make detection even when the speed of an object is very low. The pulse signals or voltages always keep a constant voltage and phase relationship. That is, the duration of the pulse voltage is constant at a predetermined level.

Figure 3:
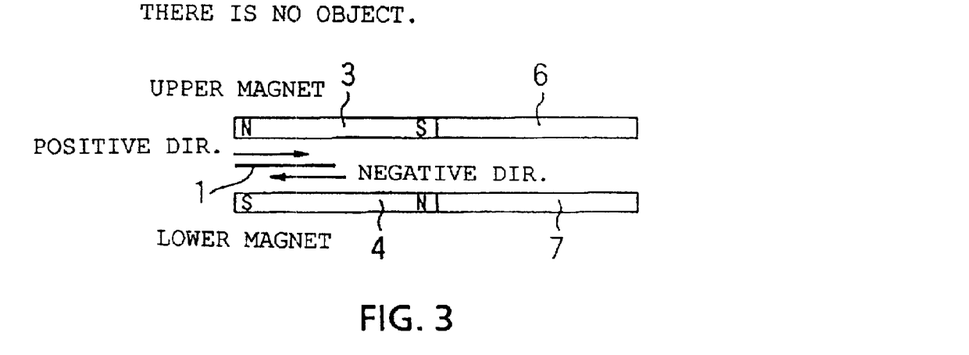
FIG. 3 is a side elevational view of the pulse signal generator in FIG. 1, to which no object is opposed.

The operational principle of the pulse signal generator will be described with respect to FIGS. 3–6. In FIG. 3, when there is no object such as the tooth of a toothed wheel, magnetic fields applied to the magnetic element 1 between the magnetic sources (3 and 6) and (4 and 7) are shown by arrows. If the magnetic element 1 is provided at the center of the two magnetic sources which have are equal in size and power, the magnetic field at the magnetic element 1 is zero (0) because the magnetic fields of the upper and lower magnetic sources in the positive and negative directions are equal in intensity and offset each other.

Figure 4:
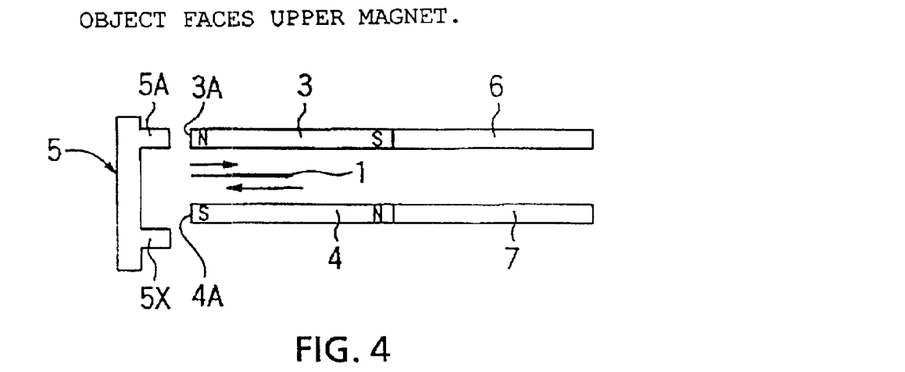
FIG. 4 is a side elevational view of the pulse signal generator in FIG. 1, wherein an object faces the upper magnet.

In FIG. 4, when the tooth 5A of the toothed wheel 5 is opposed to the N-pole 3A of the upper permanent magnet 3, the magnetic fields at the magnetic element 1 between the magnetic sources are shown by arrows. Under this set condition, the magnetic field in the positive direction by the upper magnetic source is reduced because a considerable amount of magnetic flux from the permanent magnet 3 flows into the tooth 5A of the magnetic object, whereas the magnetic field of the lower permanent magnet 4 in the negative direction is substantially equal to that of FIG. 3 because the tooth 5X is not opposed to the S-pole 4A of the permanent magnet 4. Consequently, under the set condition of FIG. 4, the magnetic field in the negative direction is applied to the magnetic element 1. This negative-direction magnetic field is called herein "second magnetic field."

Figure 5:
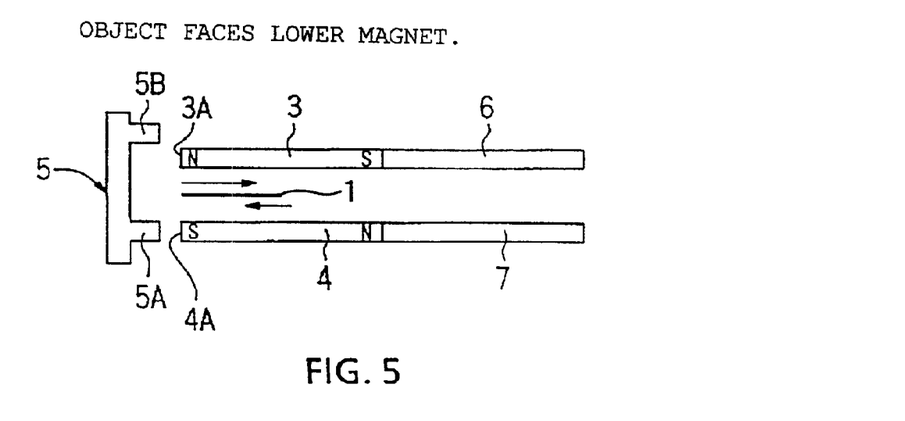
FIG. 5 is a side elevational view of the pulse signal generator in FIG. 1, wherein the object faces the lower magnet.

In FIG. 5, when the tooth 5A of the object moves away from the N-pole 3A of the upper permanent magnet 3 and faces the S-pole 4A of the lower permanent magnet 4, the magnetic fields at the magnetic element 1 are shown by arrows. The negative-direction magnetic field of the lower permanent magnet 4 is reduced by the fact that a considerable amount of magnetic flux flows into the tooth 5A of the object. On the other hand, the tooth 5B is off from the N-pole 3A of the upper permanent magnet 3 so that the positive-direction magnetic field of the permanent magnet 3 is substantially equal to that of FIG. 3. Consequently, under the reset condition of FIG. 5, the positive-direction magnetic field is applied to the magnetic element 1. This positive-direction magnetic field is called herein "first magnetic field."

Figure 6:
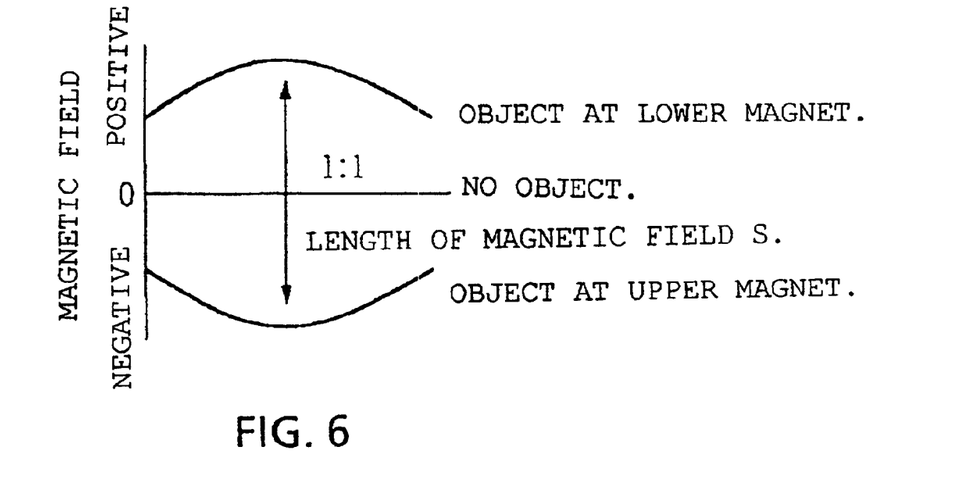
FIG. 6 is a diagram showing the magnetic field applied to the magnetic element under the respective conditions of FIGS. 3–5.

The magnetic fields applied to the magnetic element in FIGS. 3, 4, and 5 are shown in FIG. 6. By providing the magnetic element with the second and first magnetic fields in this order it is possible to cause a large Barkhausen jump and thus generate a pulse signal.

Figure 7:
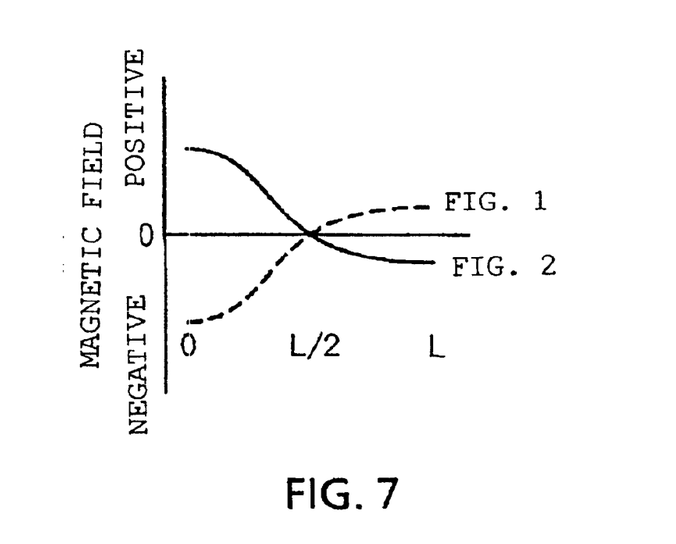
FIG. 7 is a diagram explaining where the magnetic element is disposed.

The reason that the magnetic element 1 is provided within a front half range of the magnetic sources will be described with reference to FIG. 7. When the object moves from the condition of FIG. 1 to FIG. 2, the magnetic field at the magnetic element 1 is changed as shown in FIG. 7. The curves of FIGS. 1 and 2 indicate the magnetic fields on the axis of the magnetic element 1 under the set condition of FIGS. 1 and 2, respectively. The magnetic field gap at a point 0 is greater than that of point L because the point 0 is closer to the object than the point L.

If the magnetic element 1 is provided across the entire length of the magnetic source from the point 0 to L, it is possible to use the positive, negative alternating magnetic fields from the point 0 to L/2, but the negative, positive alternating magnetic fields are used from the point L/2 to L so that the magnetic fields clash within the magnetic element 1. Consequently, changes in the magnetic field applied to the magnetic element between the set and reset conditions are so small that few satisfactory large Barkhausen jumps are provided.

When the magnetic element 1 is provided within either front or rear half range of the magnetic source or either from the point 0 to L/2 or from the point L/2 to L, no magnetic fields clash. Especially, when the magnetic element 1 is provided within the front half range or from the point 0 to L/2, the alternating magnetic field gap is increased so that satisfactory large Barkhausen jumps are provided.

This will be supplemented quantitatively. If the front and rear magnetic fields are 5 and 2 (absolute value), respectively, the alternating magnetic field is +5 where the magnetic element is provided in the front half, +2 where the magnetic element is provided in the rear half, and +3 in the front and rear sections where the magnetic element is provided across the entire length of the permanent magnets.

The magnetic source consists of a permanent magnet and a magnetic circuit forming member so that the permanent magnet can be minimized and the manufacturing cost is reduced by that much. If the length of a magnetic element varies, adaptation is easy by changing the ratio in length of the permanent magnet to the magnetic field circuit forming member.

The distance between the permanent magnets 3 and 4 may be variable. When the distance is variable, it is easy to adapt the generator to a toothed wheel which has a different tooth pitch.

Figure 8:
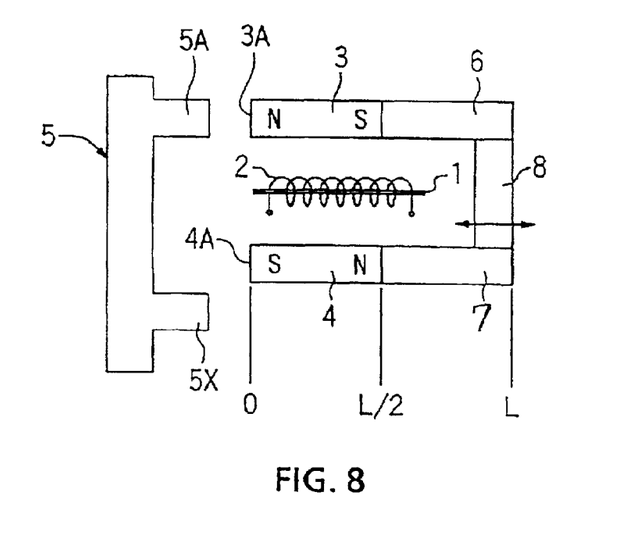
FIG. 8 is a side elevational view of a pulse signal generator according to another embodiment of the invention.

In FIG. 8, the essential structure and operational principle of this pulse signal generator are substantially the same as those of the above embodiment and, therefore, only different points will be described below.

In this embodiment, the magnetic circuit forming members 6 and 7 are connected at the ends by an auxiliary magnetic circuit forming member 8 which is made from a magnetic material. The length of the magnetic element 1 is greater than that of the permanent magnets 3 and 4 but the end of the magnetic element 1 is spaced from the auxiliary magnetic circuit forming member 8 by a predetermined distance.

Figure 9:
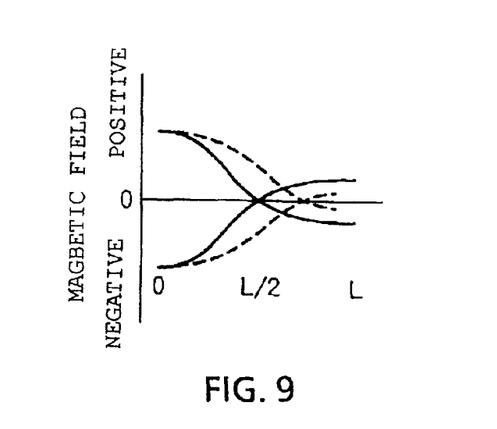
FIG. 9 is a diagram showing the effects of an auxiliary magnetic circuit forming member for the pulse signal generator in FIG. 8.

In FIG. 9, where there is no auxiliary magnetic circuit forming member 8, the polarity of a magnetic field along the center line of the pair of the magnetic sources is inverted at a point of L/2 as shown by solid line. When the auxiliary magnetic circuit forming member 8 is connected to the magnetic sources as shown in FIG. 8, the point where the polarity is inverted is moved toward the point L as shown in phantom line, making miniaturization of the equipment possible without compromising the characteristics and the manufacturing cost lower.

Figure 10:
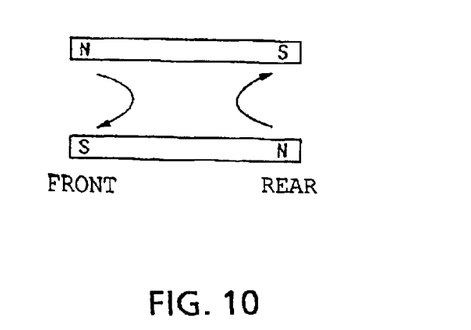
FIG. 10 is a side elevational view for explaining the effects of the auxiliary magnetic circuit forming member.

In FIG. 10, where there is a space between parallel magnets, magnetic fields are provided as shown by arrows. When a magnetic element is provided at the center of the two magnets, the magnetic fields running from the upper N pole to the lower S pole on the front side and from the lower N pole to the upper S pole on the rear side are curved into the space, respectively. These magnetic fields clash in the center of the magnetic element and are zero in absolute value. When a magnetic member is provided like the auxiliary magnetic circuit forming member 8, most of the magnetic field on the rear side flows through the magnetic member 8 and little influence on the magnetic element. Consequently, the magnetic field on the rear side become low and the magnetic fields at the magnetic element clash in the area close to the point L.

Where the position at which the auxiliary magnetic circuit forming member 8 is connected to the magnetic circuit forming members 6 and 7 is variable in the direction indicated by an arrow in FIG. 8, it is easy to adjust the magnetic field to the magnetic element to provide a sufficiently large Barkhausen jump to generate a pulse signal without failure.

The wire-like magnetic element 1 may be replaced by a thin-film, thick-film, or plate-like magnetic element. When one of these alternatives is used, the detection coil 2 may be a planar coil. Moreover, the magnetic element may be replaced by a single-layer magnetic element.

The detection coil may be substituted by a hall element, MR element, or resonance circuit.

Figure 11:
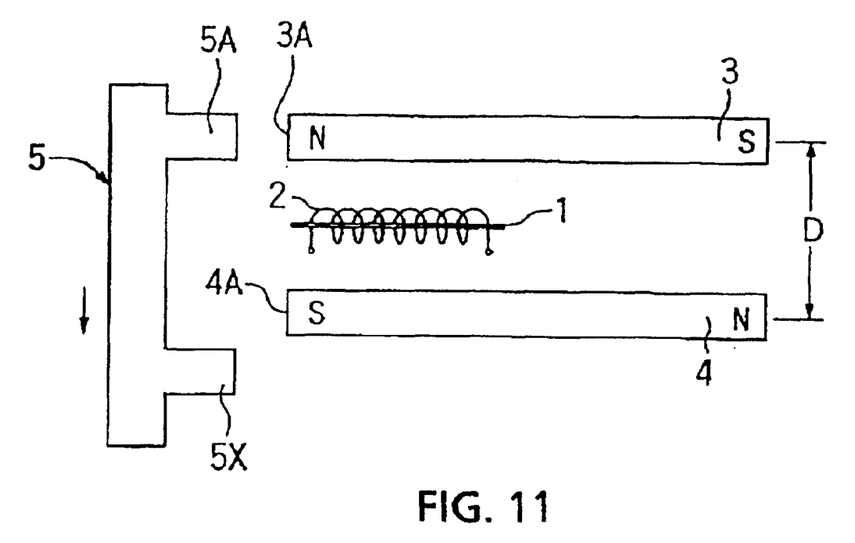
FIG. 11 is a side elevational view of a pulse signal generator according to still another embodiment of the invention.

In FIG. 11, a pulse generator comprises a magnetic element 1 having a wire-like shape, a detection coil 2 put around the magnetic element 1, and a pair of permanent magnets 3 and 4 provided on both sides of the magnetic element 1 such that their polarities are opposite to each other. The magnetic poles 3A and 4A of the permanent magnets 3 and 4 constitute a detection section which changes the magnetic field applied to the magnetic element 1 in response to sequential advance of the teeth 5A, 5B, . . . 5X of a toothed wheel 5 or object to be detected, causing large Barkhausen jumps in the magnetic element 1, thus generating pulse signals in the detection coil 2 in response to the large Barkhausen jumps.

Figure 13:
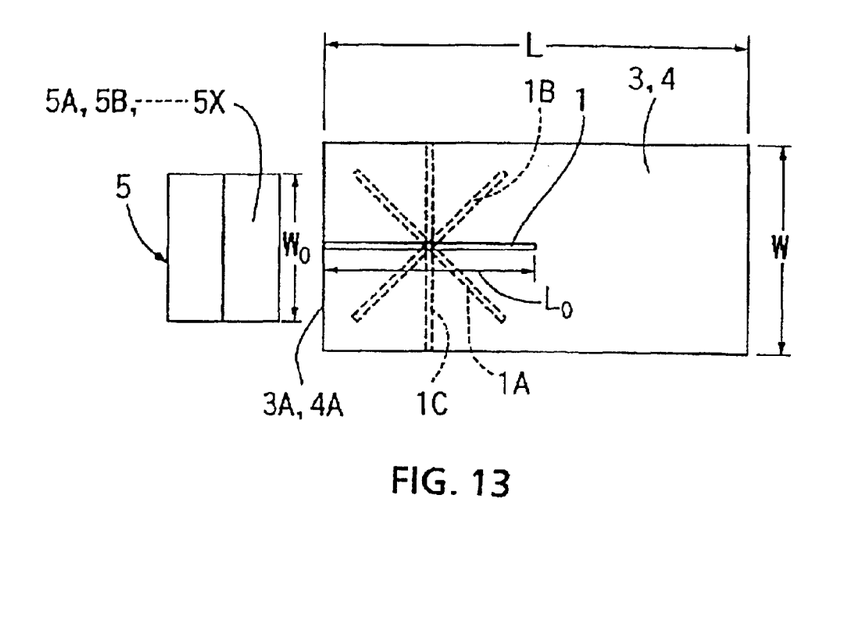
FIG. 13 is a top plan view of the pulse signal generator in FIG. 11.

In FIG. 13, the permanent magnets 3 and 4 have a plate-like shape, a magnetic axis aligned with the axis of the magnetic element 1, a length L twice the length Lo of the magnetic element 1, and a width W greater than the width Wo of the toothed wheel 5.

Figure 12:
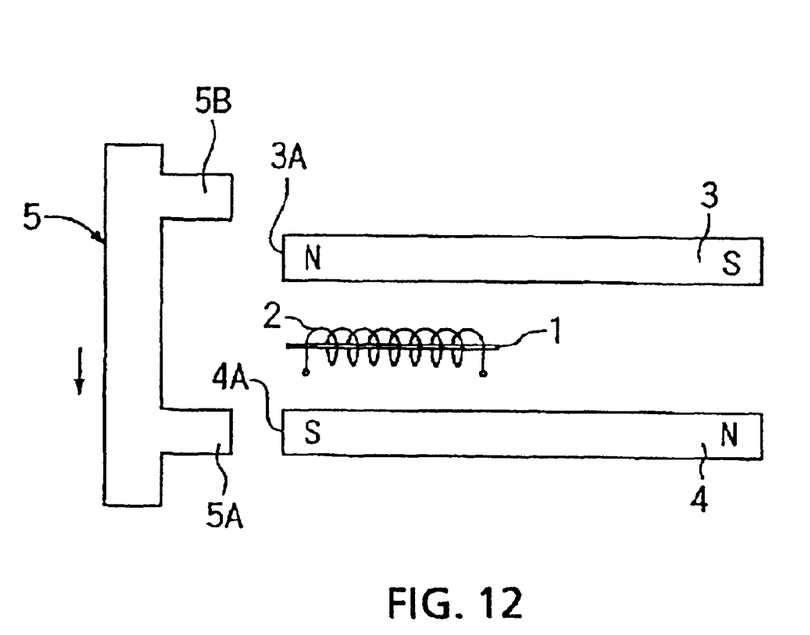
FIG. 12 is a side elevational view of the pulse signal generator in FIG. 11, which is in the reset condition.

The operation of the pulse signal generator will be described with respect to FIGS. 11 and 12. In FIG. 11, the tooth 5A of the toothed wheel 5 is opposed to the N-pole 3A of the permanent magnet 3 while the leading tooth 5X is off from the S-pole 4A of the other permanent magnet 4. Under this condition, the pulse signal generator is in the set condition. In FIG. 12, the toothed wheel 5 is advanced in the direction of an arrow so that the tooth 5A of the toothed wheel 5 is now opposed to the S-pole 4A of the permanent magnet 4 while the tailing tooth 5B is not yet opposed to the N-pole 3A of the other permanent magnet 3. Under this condition, the pulse signal generator is in the reset condition, causing a large Barkhausen jump in the magnetic element 1, which generates a pulse in the detection coil 2. In this way, every time a tooth of the toothed wheel 5 passes the magnetic poles 3A and 4A of the pair of permanent magnets 3 and 4, a pulse signal is generated in the detection coil 2.

According to the invention, the magnetic change of the magnetic element 1 by the large Barkhausen jump is detected by the detection coil 2 as a pulse voltage by electromagnetic induction. The large Barkhausen jump is caused in the magnetic element 1 without failure by the presence or absence of a tooth regardless the speed of teeth 5A, 5B, etc. of the toothed wheel 5 which is an object of detection. Thus, a pulse signal is generated in response to the large Barkhausen jump without failure. In this way, it is possible to make detection even when the speed of an object is very low. The pulse signals or voltages always keep a constant voltage and phase relationship. That is, the duration of the pulse voltage is constant at a predetermined level.

Figure 14:
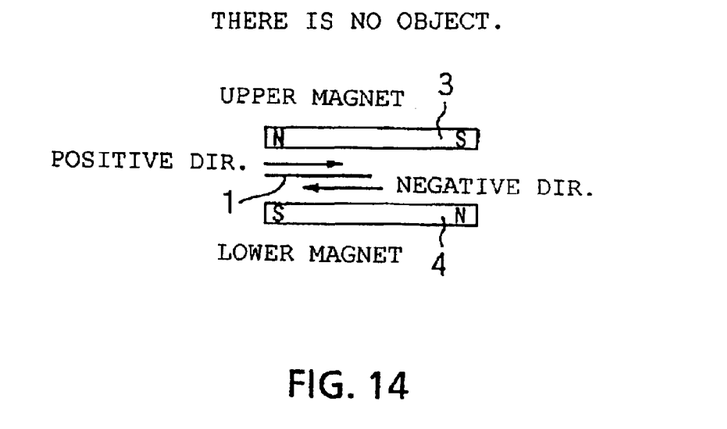
FIG. 14 is a side elevational view of the pulse signal generator in FIG. 11, to which no object is opposed.

The operational principle of the pulse signal generator will be described with respect to FIGS. 14–17. In FIG. 14, when there is no object such as the tooth of a toothed wheel, magnetic fields applied to the magnetic element 1 between the permanent magnets 3 and 4 are shown by arrows. If the magnetic element 1 is provided at the center of the two permanent magnets 3 and 4 which have are equal in size and power, the magnetic field at the magnetic element 1 is zero (0) because the magnetic fields of the upper and lower permanent magnets 3 and 4 in the positive and negative directions are equal in intensity and offset each other.

Figure 15:
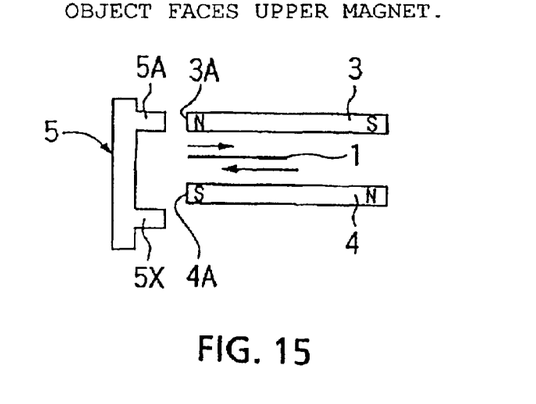
FIG. 15 is a side elevational view of the pulse signal generator in FIG. 11, wherein an object faces the upper magnet.

In FIG. 15, when the tooth 5A of the toothed wheel 5 is opposed to the N-pole 3A of the upper permanent magnet 3, the magnetic fields at the magnetic element 1 between the permanent magnets 3 and 4 are shown by arrows. Under this set condition, the magnetic field in the positive direction by the upper permanent magnet 3 is reduced because a considerable amount of magnetic flux from the permanent magnet 3 flows into the tooth 5A of the magnetic object, whereas the magnetic field of the lower permanent magnet 4 in the negative direction is substantially equal to that of FIG. 14 because the tooth 5X is not opposed to the S-pole 4A of the permanent magnet 4. Consequently, under the set condition of FIG. 15, the magnetic field in the negative direction is applied to the magnetic element 1. This negative-direction magnetic field is called herein "second magnetic field."

Figure 16:
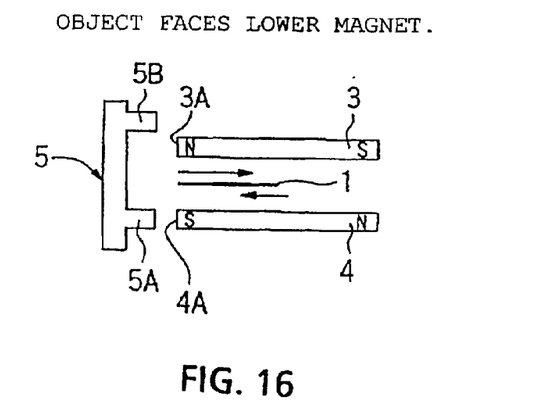
FIG. 16 is a side elevational view of the pulse signal generator in FIG. 11, wherein the object faces the lower magnet.

In FIG. 16, when the tooth 5A of the object moves away from the N-pole 3A of the upper permanent magnet 3 and faces the S-pole 4A of the lower permanent magnet 4, the magnetic fields at the magnetic element 1 are shown by arrows. The negative-direction magnetic field of the lower permanent magnet 4 is reduced by the fact that a considerable amount of magnetic flux flows into the tooth 5A of the object. On the other hand, the tooth 5B is off from the N-pole 3A of the upper permanent magnet 3 so that the positive-direction magnetic field of the permanent magnet 3 is substantially equal to that of FIG. 14. Consequently, under the reset condition of FIG. 16, the positive-direction magnetic field is applied to the magnetic element 1. This positive-direction magnetic field is called herein "first magnetic field."

Figure 17:
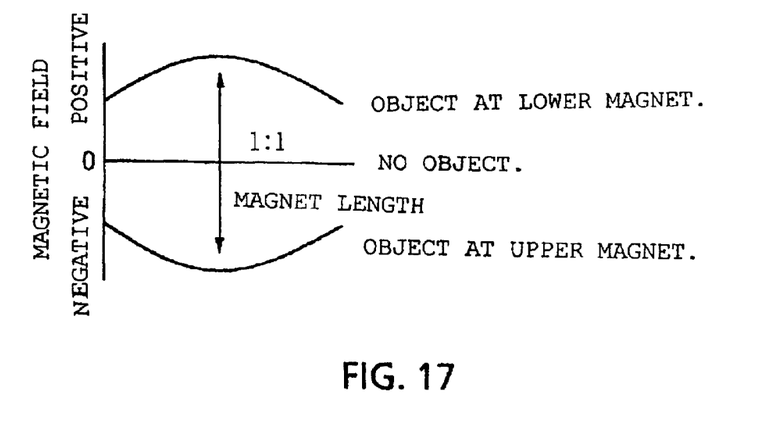
FIG. 17 is a diagram showing the magnetic field applied to the magnetic element under the respective conditions of FIGS. 14–16.

The magnetic fields applied to the magnetic element in FIGS. 14–16 are shown in FIG. 17. By providing the magnetic element with the second and first magnetic fields in this order it is possible to cause a large Barkhausen jump and thus generate a pulse signal.

Figure 18:
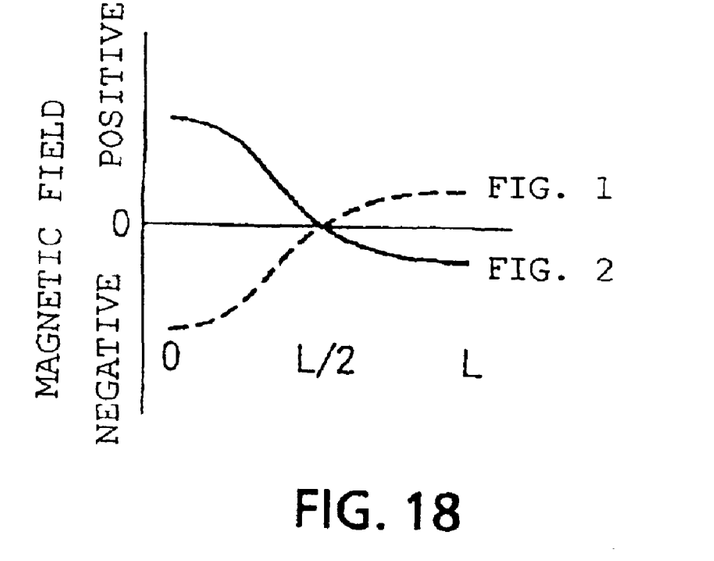
FIG. 18 is a diagram explaining where the magnetic element is disposed.

The reason that the magnetic element 1 is provided within a front half range of the permanent magnets 3 and 4 will be described with reference to FIG. 18. When the object moves from the condition of FIG. 11 to FIG. 12, the magnetic field at the magnetic element 1 is changed as shown in FIG. 18. The curves of FIGS. 11 and 12 indicate the magnetic fields on the axis of the magnetic element 1 under the set condition of FIGS. 11 and 12, respectively. The magnetic field gap at a point 0 is greater than that of point L because the point 0 is closer to the object than the point L.

If the magnetic element 1 is provided across the entire length of the permanent magnets 3 and 4 or from the point 0 to L, it is possible to use the positive, negative alternating magnetic fields from the point 0 to L/2, but the negative, positive alternating magnetic fields are used from the point L/2 to L so that the magnetic fields crash within the magnetic element 1. Consequently, changes in the magnetic field applied to the magnetic element between the set and reset conditions are so small that few satisfactory large Barkhausen jumps are provided.

When the magnetic element 1 is provided within either front or rear half range of the permanent magnets or either from the point 0 to L/2 or from the point L/2 to L, no magnetic fields clash. Especially, when the magnetic element 1 is provided within the front half range or from the point 0 to L/2, the alternating magnetic field gap is increased so that satisfactory large Barkhausen jumps are provided.

This will be supplemented quantitatively. If the front and rear magnetic fields are 5 and 2 (absolute value), the alternating magnetic field is +5 where the magnetic element is provided in the front half, +2 where the magnetic element is provided in the rear half, and +3 in the front and rear sections where the magnetic element is provided across the entire length of the permanent magnets.

Figure 19:
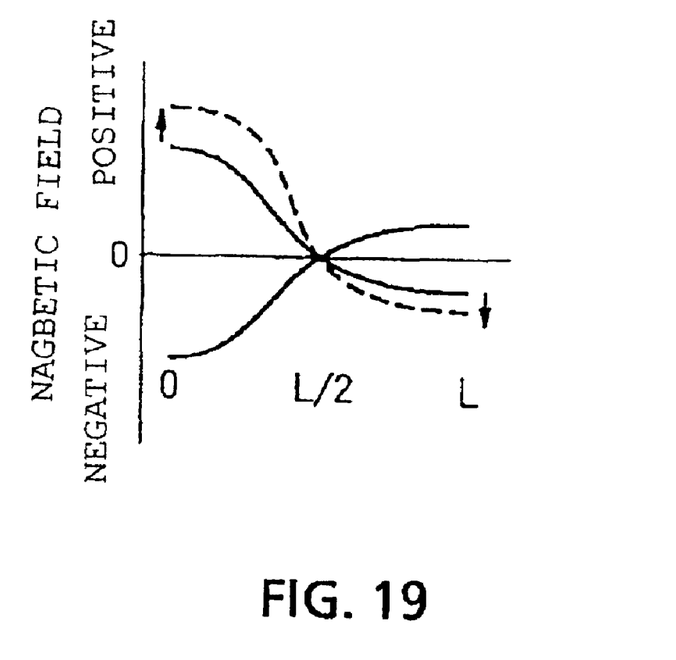
FIG. 19 is a diagram indicating the relationship between the object width and the magnetic width.

The reason that the width W of the permanent magnets 3 and 4 is greater than the width Wo of the tooth 5A, 5B, . . . 5X will be described with respect to FIG. 19. When the width of the permanent magnets increases, not only the power of the permanent magnets but also the area of the object upon which the permanent magnets act increase so that the alternating magnetic field gap increases as shown by arrows, thus providing better large Barkhausen jumps.

When the magnetic element is covered by the magnets, it is more resistant against external influence, such as other magnets around the detector. When the width of the permanent magnets is increased, the area resistant against external influence is increased so that arrangement design of the magnetic element enjoys more freedom than before.

Alternatively, the magnetic element 1 may be provided at an angle with the permanent magnets 3 and 4. For example, as shown by phantom line in FIG. 13, a magnetic element 1A, 1B, or 1C may be provided at an angle of 45, 135, or 90 degrees with the axis of the permanent magnet.

The distance D between the permanent magnets 3 and 4 may be variable. When the distance D is variable, it is easy to adapt the generator to a toothed wheel which has a different tooth pitch.

The permanent magnets 3 and 4 may be replaced by electromagnets or the like.

According to the invention it is possible to detect very low liner or rotary speed. The resulting pulse signals have a constant voltage and phase relationship and are distinct from noise and need no limiter.

It is possible to provide a very high resolution and accurate timing.

The magnetic element is flanked by the magnets so that it is resistant against external magnetic influence.

As long as an object is magnetic, it may be detected and no separate movable body is necessary. Also, it is possible to make the generator need no power. It is easy to make it explosion proof.

The generator is so simple that it is made up of magnetic field sources, a magnetic element, and a detection coil.

When the distance between the magnets is variable, it is easy to adapt the detector to the object of different pitches to detect accurately the teeth of a toothed wheel.

Since the magnetic sources consist of a magnet and a magnetic circuit forming member, the size of the permanent magnet and the manufacturing cost can be reduced.

The use of the magnetic circuit forming member and the auxiliary magnetic circuit forming member makes it easy to adjust the magnetic field to the magnetic element.

The magnetic element is flanked by magnets so that it is provided at a given angle with the magnets.

What is claimed is:

1. A method of generating a pulse signal, comprising the steps of:

providing a pair of magnets in parallel to each other such that their opposite poles are faced to each other;

providing a magnetic element between said magnets;

placing an object at a first position which is opposed to one of said opposite poles to apply a negative-direction magnetic field said magnetic element;

advancing said object to a second position which is opposed to the other of said opposite poles to apply a positive-direction magnetic field to said magnetic element, thus changing a direction and amount of said magnetic field applied to said magnetic element, which causes a large Barkhausen jump in said magnetic element; and generating a pulse signal in response to said large Barkhausen jump, wherein said opposite poles of said magnets have a variable distance.

2. A method of generating a pulse signal, comprising the steps of:

providing a pair of magnets in parallel to each other such that their opposite poles are faced to each other;

providing a magnetic element between said magnets;

placing an object at a first position which is opposed to one of said opposite poles to apply a negative-direction magnetic field said magnetic element;

advancing said object to a second position which is opposed to the other of said opposite poles to apply a positive-direction magnetic field to said magnetic element, thus changing a direction and amount of said magnetic field applied to said magnetic element, which causes a large Barkhausen jump in said magnetic element; and generating a pulse signal in response to said large Barkhausen jump, wherein said magnets have a width greater than that of said object.

3. A method of generating a pulse signal, comprising the steps of:

providing a pair of magnets in parallel to each other such that their opposite poles are faced to each other;

providing a magnetic element between said magnets;

placing an object at a first position which is opposed to one of said opposite poles to apply a negative-direction magnetic field said magnetic element;

advancing said object to a second position which is opposed to the other of said opposite poles to apply a positive-direction magnetic field to said magnetic element, thus changing a direction and amount of said magnetic field applied to said magnetic element, which causes a large Barkhausen jump in said magnetic element; and generating a pulse signal in response to said large Barkhausen jump, wherein said magnetic element extends from said one end of said magnets to a predetermined distance from the other end of said magnets.

4. A method of generating a pulse signal according to claim 3, wherein said predetermined distance is no more than one half of said magnets.

5. A method of generating a pulse signal, comprising the steps of:

providing a pair of magnets in parallel to each other such that their opposite poles are faced to each other;

providing a magnetic element between said magnets;

placing an object at a first position which is opposed to one of said opposite poles to apply a negative-direction magnetic field said magnetic element;

advancing said object to a second position which is opposed to the other of said opposite poles to apply a positive-direction magnetic field to said magnetic element, thus changing a direction and amount of said magnetic field applied to said magnetic element, which causes a large Barkhausen jump in said magnetic element; and generating a pulse signal in response to said large Barkhausen jump, wherein said magnetic element extends at a predetermined angle with a longitudinal direction of said magnets.

6. A pulse signal generator comprising:

a magnetic element able to cause a large Barkhausen jump;

detection means for detecting a magnetic changes in said magnetic element to generate a pulse signal; and a pair of magnetic field sources consisting of parallel magnets and magnetic circuit forming members and provided in parallel to each other on opposite sides of said magnetic element such that their opposite poles are faced to each other so that when an object advances from one of said opposite poles to the other, a magnetic field applied to said magnetic element changes to cause a large Barkhausen jump in said magnetic element, thus causing said detection means to generate a pulse signal, which further comprises an auxiliary magnetic circuit forming member provided between said magnetic circuit forming members for connecting said magnetic circuit forming members.

7. A pulse signal generator according to claims 6, wherein said auxiliary magnetic circuit forming member is connected to said magnetic circuit forming members at varying points.

8. A pulse signal generator according to claims 6, wherein said magnetic element is spaced at an end thereof from said auxiliary magnetic circuit forming member by a predetermined distance.

9. A pulse signal generator comprising:

a magnetic element able to cause a large Barkhausen jump;

detection means for detecting a magnetic changes in said magnetic element to generate a pulse signal; and a pair of magnetic field sources consisting of only magnets and provided in parallel to each other on opposite sides of said magnetic element such that their opposite poles are faced to each other so that when an object advances from one of said opposite poles to the other, a magnetic field applied to said magnetic element changes to cause a large Barkhausen jump in said magnetic element, thus causing said detection means to generate a pulse signal, wherein said opposite poles of said magnets have a variable distance.

10. A pulse signal generator comprising:

a magnetic element able to cause a large Barkhausen jump;

detection means for detecting a magnetic changes in said magnetic element to generate a pulse signal; and a pair of magnetic field sources consisting of only magnets and provided in parallel to each other on opposite sides of said magnetic element such that their opposite poles are faced to each other so that when an object advances from one of said opposite poles to the other, a magnetic field applied to said magnetic element changes to cause a large Barkhausen jump in said magnetic element, thus causing said detection means to generate a pulse signal, wherein said magnets have a width greater than that of said object.

11. A pulse signal generator comprising:

a magnetic element able to cause a large Barkhausen jump;

detection means for detecting a magnetic changes in said magnetic element to generate a pulse signal; and a pair of magnetic field sources consisting of only magnets and provided in parallel to each other on opposite sides of said magnetic element such that their opposite poles are faced to each other so that when an object advances from one of said opposite poles to the other, a magnetic field applied to said magnetic element changes to cause a large Barkhausen jump in said magnetic element, thus causing said detection means to generate a pulse signal, wherein said magnetic element extends from said one end of said magnets to a predetermined distance from the other end of said magnets.

12. A pulse signal generator according to claim 11, wherein said predetermined distance is no more than one half of said magnets.

13. A pulse signal generator comprising:
- a magnetic element able to cause a large Barkhausen jump;
- detection means for detecting a magnetic changes in said magnetic element to generate a pulse signal; and
- a pair of magnetic field sources consisting of only magnets and provided in parallel to each other on opposite sides of said magnetic element such that their opposite poles are faced to each other so that when an object advances from one of said opposite poles to the other, a magnetic field applied to said magnetic element changes to cause a large Barkhausen jump in said magnetic element, thus causing said detection means to generate a plus signal, wherein said magnetic element extends at a predetermined angle with a longitudinal direction of said magnets.

* * * * *